United States Patent [19]
Chen

[11] Patent Number: 5,702,968
[45] Date of Patent: Dec. 30, 1997

[54] METHOD FOR FABRICATING A HONEYCOMB SHAPED CAPACITOR

[75] Inventor: Chung-Zen Chen, Hsinchu, Taiwan

[73] Assignee: Vanguard International Semiconductor Corporation, Hsin-Chu, Taiwan

[21] Appl. No.: 585,067

[22] Filed: Jan. 11, 1996

[51] Int. Cl.$^6$ .................................................. H01L 21/70
[52] U.S. Cl. ............................. 437/52; 437/60; 437/919
[58] Field of Search ............................... 437/52, 919, 47, 437/48, 60

[56] References Cited

U.S. PATENT DOCUMENTS

| | | | |
|---|---|---|---|
| 5,204,280 | 4/1993 | Dhong et al. | 437/52 |
| 5,254,503 | 10/1993 | Kenney | 437/228 |
| 5,256,587 | 10/1993 | Jun et al. | 437/52 |
| 5,302,540 | 4/1994 | Ko et al. | 437/47 |
| 5,340,763 | 8/1994 | Dennison | 437/52 |
| 5,429,979 | 7/1995 | Lee et al. | 437/52 |
| 5,429,980 | 7/1995 | Yang et al. | 437/52 |

OTHER PUBLICATIONS

S. Wolf and R.N. Tauber, "Silicon Processing for the VLSI Era vol. 1—Process Technology", Lattice Press, 1986, pp. 175, 187–189.

"The Fabrication and Electrical Properties of Modulated Stacked Capacitor for Advanced DRAM Applications" YK Jun et al, 0741-3106192 IEEE Device Letters, vol. 13, No. 80, Aug. 1992, pp. 430–432.

"Nucleation and Growth Mechanism of Hemispherical Grain Polycrystalline Silicon", N. Matsuo et al, Appl. Phys Lett. 60(21) 25 May 1992, 0003–6951/92/212607–03 pp. 2607–2609.

"The Honeycomb-Shape Capacitor Structure for VLSI DRAM" Sanggi Yu et al, IEEE Electron Device Letters, vol. 14, No. 8, Aug. 1993, pp. 369–371.

*Primary Examiner*—John Niebling
*Assistant Examiner*—Joni Y. Chang
*Attorney, Agent, or Firm*—George O. Saile; Stephen B. Ackerman; William J. Stoffel

[57] ABSTRACT

A method of fabricating a honeycomb shape capacitor is provided. A first polysilicon layer having a contact to a device area is formed over an insulation layer. A first oxide layer is formed over the first polysilicon layer. A layer of hemispherical particles, is formed over the first oxide layer. The first oxide layer is anisotropically etched using the hemispherical particles as a mask forming pattern of vertical extensions. A doped polysilicon layer is formed over the hemispherical particle layer and the pattern of vertical extensions. The doped polycrystalline layer and the hemisphere particle layer are etched back to expose the tops of the vertical extensions of the first oxide layer. The vertical extensions of the first oxide layer removed by a selective etch forming honeycomb holes in the doped polysilicon layer thereby forming the honeycomb shaped bottom storage electrode. A capacitor dielectric layer and a top plate electrode are formed over the bottom storage electrode to complete the honeycomb shaped capacitor.

17 Claims, 6 Drawing Sheets

METHOD FOR FABRICATING A HONEYCOMB SHAPED CAPACITOR

BACKGROUND OF INVENTION

1. Field of the Invention

The present invention relates generally to fabrication of capacitors and more particularly to a method for fabricating a highly integrated semiconductor memory having a honeycomb shaped capacitor.

2. Description of the Prior Art

The development of the semiconductor industry has always followed that of the Dynamic Random Access Memory (DRAM) technology in that the DRAM development has led in the use of the highest density technology elements capable of being produced in manufacturable quantities. The development of DRAM's in the 4 Megabit density range began to depart from the twenty year tradition of two-dimensional DRAM designs by the appearance of three-dimensional DRAM cell structures, most notable by the use of trench capacitors. Proposed designs for DRAM cells in 16 MB, 64 MB and high density range have also included the use of multi-plate or stacked storage capacitor cell designs. Although the use of stacked cell technology has rendered the processing of DRAMs more complex such techniques continue to be used extensively.

The decrease in cell capacitance caused by reduced memory cell area is a serious obstacle to increasing packing density in dynamic random access memories (DRAMs). Thus, the problem of decreased cell capacitance must be solved to achieve higher packing density in a semiconductor memory device, since decreased cell capacitance degrades read-out capability and increases the soft error rate of memory cells as well as consumes excessive power during low-voltage operation by impeding device operation.

Generally, in a 64 MB DRAM having a 1.5 $\mu m^2$ memory cell area employing an ordinary two dimensional stacked capacitor cell, sufficient cell capacitance cannot be obtained even though a higher dielectric constant material, e.g., tantalum oxide ($Ta_2O_5$), is used. Therefore, stacked capacitors having a three-dimensional structure have been suggested to improve cell capacitance. Such stacked capacitors include, for example double-stacked, fin-structured, cylindrical, spread-stacked, and box structured capacitors.

Since both outer and inner surfaces can be utilized as an effective capacitor area, the cylindrical structure is favorably suited to the three-dimensional stacked capacitor, and is more particularly suitable for an integrated memory cell which is 64 Mb or higher. Also, an improved stacked capacitor has recently been presented, where pillars or another inner cylinder is formed in the interior of the cylinder. Not only may both of the inner and outer surfaces of the cylinder be utilized as the effective capacitor area, but also the outer surface of the pillars or the inner cylinder formed in the interior of the cylinder. However, even more surface area and capacitance are required to achieve higher densities.

Recently, new technologies for increasing the effective surface area by modifying the surface morphology of the polysilicon storage electrode itself by engraving or by controlling the nucleation and growth condition of polysilicon have been developed. A hemispherical-grain (HSG) polysilicon layer can be deposited over a storage node to increase surface area and capacitance as taught in U.S. Pat. No. 5,340,763, to Dennison.

The following US patents show related processes and capacitor structures: U.S. Pat. No. 5,254,503, Kenny, U.S. Pat. No. 5,256,587, Jun. et al., U.S. Pat. No. 5,302,540, Ko et al., U.S. Pat. No. 5,340,763, Dennison, and U.S. Pat. No. 5,204,280, Dhong et al. Other related articles include: *The Fabrication and Electrical Properties of Modulated Stacked Capacitor for Advanced DRAM Applications*, Y. K. Jun, et al. 0741-3106/92 IEEE Device letters, vol. 13, No. 80, August 1992, p. 430–432; *Nucleation and Growth Mechanism Of Hemispherical Grain Polycrystalline Silicon*, N. Matsuo et al., Appl. Phys. Lett. 60 (21), 25 May 1992 0003-6951/92/212607-03 p. 2607–2609; and *The Honeycomb-Shape Capacitor Strutcture for ULSI DRAM*, Sanggi Yu, et al, IEEE Electron Device Letters, Vol., 14, No 8, August 1993, p. 369–371.

However, many of these methods require substantially more processing steps or/and planar structures which make the manufacturing process more complex and costly. Also, other process methods rely on etching to a predetermined etch depth which can be quite difficult to control in a manufacturing environment. For example, during plasma etching outgassing, virtual or real leaks, back streaming from pumps and loading effects, to name a few, can change the chemistry of the etching environment in the process chamber, making a calibrated etch time approach difficult to control. Therefore, it is very desirable to develop processes that are as simple as possible and also provide methods which have large process windows.

In prior processes, for example in U.S. Pat. No. 5,254,503, Kenny and U.S. Pat. No. 5,302,540, Ko et at., hemispherical particles are used as masks to define pillarets (vertical pins) on the storage node. A HSG layer is formed over a silicon oxide layer and a polysilicon layer (i.e., storage plate). The HSG layer is used as an etch mask to form pillarets from the polysilicon layer. However, capacitors formed this way suffer from field dependent leakage current which degrades the capacitor performance. This leakage is acerbated when a reactive ion etch (RIE) is used to etch the polysilicon. It is thought that the RIE causes damage to the surface of the pillarets. See *Fabrication and Electrical Properties of Modulated Stacked Capacitor for Advanced DRAM Applications*, Y. K. Jun, et al. 0741-3106/92 IEEE Device letters, vol. 13, No. 80, August 1992 p. 430–432. Therefore this is a need to develop a method of forming capacitors having pillarets or small structures which do not have field-leakage problems.

There is a challenge to develop methods of manufacturing these capacitors that minimize the manufacturing costs and maximize the device yields. In particular, there is a challenge to develop a method which minimizes the number of photoresist masking operations and provides maximum process tolerance to maximize product yields. There is also a challenge to develop a method to produce a capacitor with a larger capacitance, higher reliability and which is easy to manufacture.

SUMMARY OF THE INVENTION

It is an object of the present invention to provide a novel method for fabricating a honeycomb shaped capacitor which ensures high reliability and large cell capacitance.

It is another object of the present invention to provide a novel method for fabricating a honeycomb shaped capacitor of a semiconductor memory device, which does not have field leakage, ensures high reliability and large cell capacitance.

It is yet another object of the present invention to provide a method for fabricating a honeycomb shaped capacitor of a semiconductor memory device, which has low field leakage, an even distribution of honeycombs and is easy to manufacture, inexpensive to manufacture and uses a minimum number of masking operations.

To accomplish the above objectives, the present invention provides a method of manufacturing a honeycomb shaped capacitor for a DRAM which is characterized in that a first planarization layer is formed over a substrate surface. Next, a node contact hole is etched through the first planarization layer. A first polysilicon layer is formed on the first planarization layer and filling the node contact hole.

A first insulation layer is formed over the first polysilicon layer. A second polysilicon layer, consisting of grains (e.g., hemispherical grains (HSG)), is formed over the first insulation layer. The HSG's are preferably formed by a two step oxygen anneal process which produces a more uniform distribution of HSGs. The first insulation layer is anisotropically etched using the second polysilicon layer as a mask forming pattern of vertical extensions (e.g., pillars) of the first insulation layer. A third polysilicon layer is formed over the second polysilicon layer and the pattern of vertical extensions. The third polycrystalline layer and the second polysilicon layer are etched back to expose the tops of the vertical extensions of the first insulation layer. The vertical extensions of the first insulation layer are removed by a selective etch forming holes in place of the vertical extensions in the third conductive layer thereby forming the first conductive layer into a honeycomb structure. The first polysilicon layer and the honeycomb structure of the third conductive layer form the bottom storage electrode. A capacitor dielectric layer and a top plate electrode are formed over the bottom storage electrode. Insulation layers and a bit line contact can be formed to complete the memory cell having a honeycomb shaped capacitor of the present invention.

The method of the current invention forms a honeycomb shaped capacitor which has a high surface area and capacitance. The capacitor does not suffer field leakage since the polysilicon honeycombs are not subjected to a damaging reactive ion etch (RIE). The process is simple and inexpensive to manufacture. Moreover, the process provides better control of honeycomb structure in both the vertical and lateral dimensions. The honeycombs are defined by the vertical extensions of the first insulation layer which are defined using the an etch stop process, not a timed etch. Since the vertical dimension of the honeycomb are defined by the thickness of the first insulation layer and not by the depth of a timed etch, the invention provides more uniform controllable and height honeycombs. Also, the two step oxygen anneal to form the HSG provides a more uniform distribution of HSGs and therefore provides a more uniform distribution of honeycombs in the storage electrode. This results in more uniform lateral honeycomb dimensions which increases the capacitance of the capacitor.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Now in keeping with the objectives of this invention, the method for forming a DRAM storage capacitor having a honeycomb shaped capacitor is described in detail. The sequence of fabrication steps for a honeycomb shaped capacitor is shown in FIGS. 1 through 10. The process for forming the field oxide and the field effect transistor structure as presently practiced in manufacturing DRAM cells are only briefly described first in order to better understand the current invention. It should be well understood by one skilled in the art that by including additional process steps not described in this embodiment, other types of devices can also be included on the memory chip. For example, P wells in the P substrate and CMOS circuit can be formed therefrom. It should also be understood that the figures depict only one DRAM storage cell out of a multitude of cells that are fabricated simultaneously on the substrate. Also, the capacitor can be used in other chip types in addition to DRAM chips. In addition the conductivity types (i.e., P and N) of the elements can be reversed as known to those skilled in the art.

Figure 1:
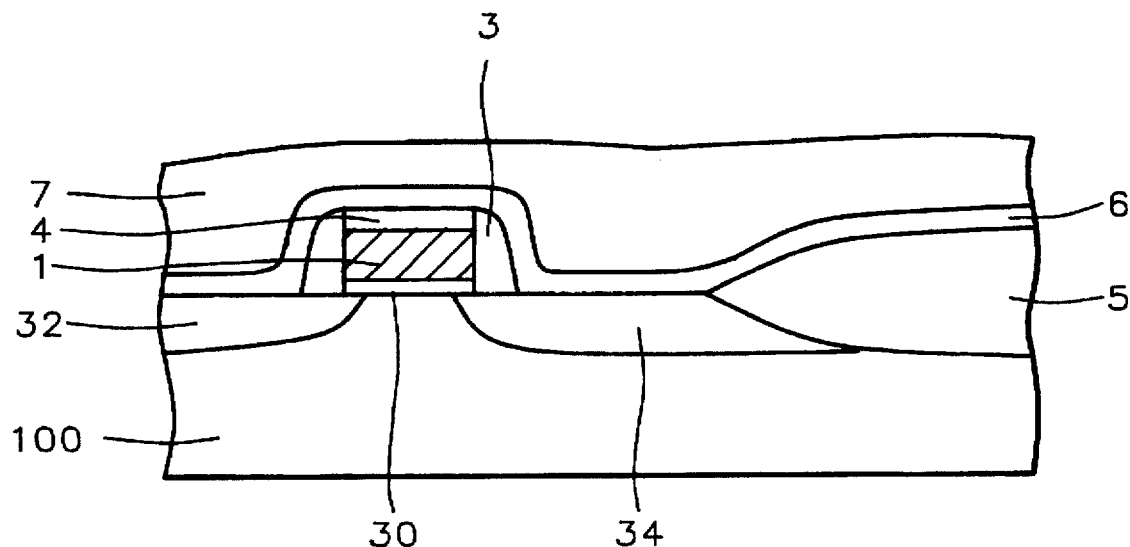
FIGS. 1 through 8 are cross sectional views for illustrating a method for manufacturing a honeycomb shaped capacitor according to the present invention.

Referring now to FIG. 1, a cross-sectional view of the substrate 100 having a partially completed DRAM cell formed on the substrate surface is schematically shown. A field oxide layer 5 is formed on a semiconductor substrate 100 for defining active regions and isolation regions. The preferred substrate is composed of a P-type single crystal silicon having a (100) crystallographic orientation. A relatively thick field oxide (FOX) 5 is formed around the active device areas to electrically isolate these areas. This field oxide 5 is formed by masking the active device areas with a thick silicon oxide (pad oxide) and a thicker silicon nitride layer which forms an oxidation barrier. The silicon substrate is then oxidized in an oxidizing ambient to form the field oxide. The preferred thickness is in the range of about 3000 to 5000 Å.

The semiconductor device is then formed in the active device area after removing the silicon nitride barrier layer and the pad oxide in a conventional wet etch. The most commonly used device for dynamic random access memory is MOSFET. This device is formed by first thermally oxidizing the active device area to form a thin gate oxide 30. The preferred thickness is from about 70 to 200 Å.

An appropriately doped polysilicon layer and an insulating layer are deposited on substrate 100 and conventional photolithographic techniques are used to pattern the gate oxide layer, the polysilicon layer and the insulating layer. This forms the transfer gate 30 1 4 of the MOSFET in the active device areas. Also, other conductive patterns (e.g., word lines—not shown) can be formed elsewhere on the substrate. Portions of the conductive patterns can form the word lines that electrically connect the MOSFET gate electrode to the appropriate peripheral circuits on the DRAM chip.

The lightly doped source/drain 32 34 of the N-channel MOSFET are formed next, usually by implanting an N-type atomic species, such as arsenic or phosphorus, through the spaces between the gate electrodes 30 1 4. For example, a typical implant might consist of phosphorus P31 at a dose of between about 1 to 10 E13 atoms/cm$^2$ and at an energy between about 30 to 80 Kev.

After forming the lightly doped source/drain 32 34, sidewall spacers 3 are formed on the gate electrode 30 1 4 sidewalls. These sidewall spacers 3 are formed by depositing a low temperature silicon oxide and anisotropically etching back to the silicon substrate surface. For example, the silicon oxide could be a chemical vapor deposition using tetraethoxysilane (TEOS) at a temperature in the range of about 650° to 900° C. and the etch back performed in a low pressure reactive ion etcher. The sidewall spacers 3 can have a thickness in the range of between about 1000 to 2000 Å.

Following this, a conformal first insulating layer 6 is formed over the substrate surface and contacts the source and drain areas 32 34 as shown in FIG. 1. The conformal first insulating layer is preferably formed of silicon nitride or silicon oxide. The conformal insulating layer 6 is more preferably composed of silicon oxide formed by a low temperature TEOS process. Layer 6 preferably has a thickness in the range between about 1000 and 1500 Å and more preferably about 1000 Å.

A first planarization layer 7 is then formed over the conformal insulating layer 24. The first planarization layer 7 can be formed of phosphosilicate glass (PSG), silicon oxide, and borophosphosilicate glass (BPSG). The first planarization layer 7 can be formed of silicon oxide formed by a low temperature chemical vapor deposition using tetraethoxysilane (TEOS). The first planarization layer 7 is more preferably formed of borophosphosilicate glass (BPSG). A borophosphosilicate glass layer can be formed by low pressure chemical vapor deposition (LPCVD) using tetraethylorthosilicate (TEOS) as a reactant. Boron and phosphorus are added to the ambient during the formation of the borophosphosilicate glass layer. The BPSG layer is thermally treated at a temperature of 850° C. for 30 minutes to cause flow and planarization. The first planarization layer 7 preferably has a thickness in the range of about 3000 and 7000 Å and more preferably a thickness of about 5000 Å.

Figure 2:
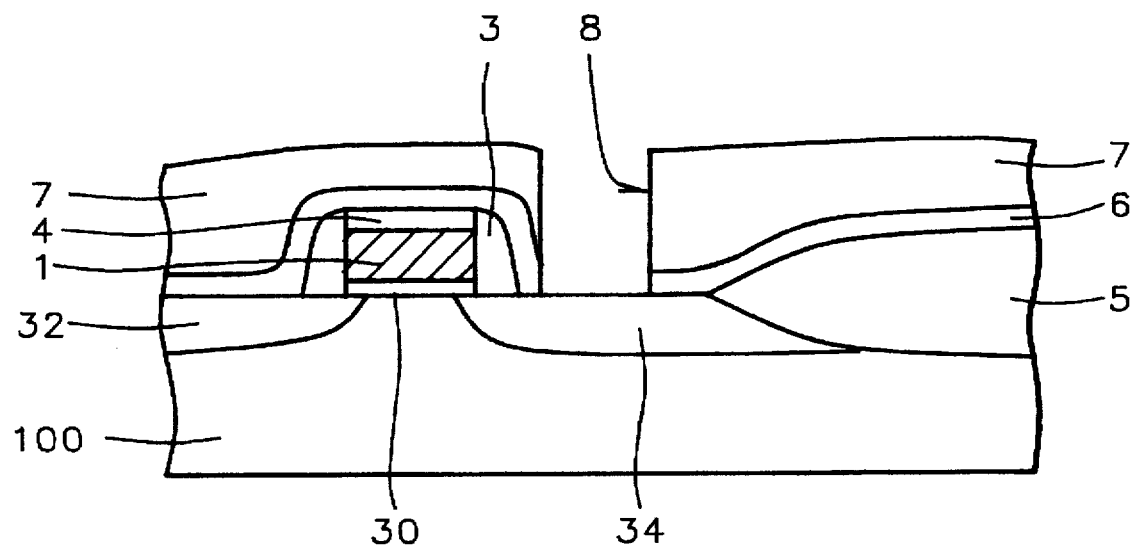

As displayed in FIG. 2, a node contact hole 8 is etched though the first planarization layer 7 exposing the source 34. The node contact hole 8 is preferably formed by an anisotropic etch, such as a plasma oxide etch.

The remainder of this embodiment relates more specifically to those objects of the invention, which relate to the formation of the storage capacitor having increased capacitance and also providing a more manufacturable process. The new capacitor structure is formed having a honeycomb structure.

Figure 3:
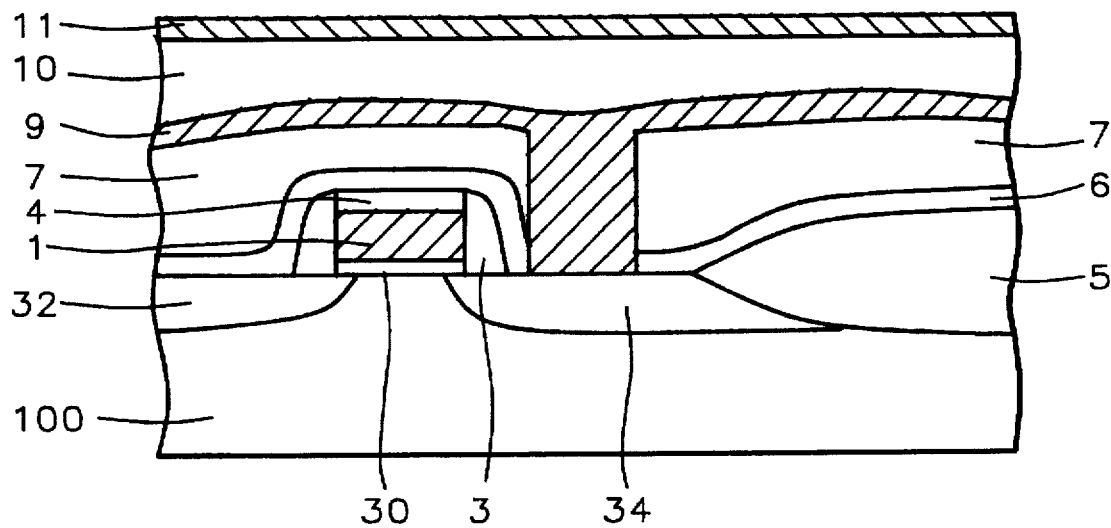

As shown in FIG. 3, a first polysilicon layer 9 is deposited on the first planarization layer 7 and filling the node contact hole 8. The first polysilicon layer 9 forms an electrical contact with the underlying active area 32. The first polysilicon layer 9 is formed of n doped polysilicon having an impurity concentration in the range between about 1E19 and 1E20 atoms/cm$^3$ and a thickness in the range between about 2000 and 3000 Å and more preferably about 2500 Å. The first polysilicon layer 9 functions as a node contact as well as the bottom portion of the storage electrode.

Next, a first insulation layer 10 is formed over the first polysilicon layer 9. The first insulation layer 10 preferably is composed of silicon oxide, a doped oxide or borophosphosilicate glass (BPSG) and is more preferably formed of silicon oxide formed by a TEOS process. The first insulation layer 10 can have a thickness in the range between about 4000 and 7000 Å and more preferably about 5000 Å.

As shown in FIG. 3, a polysilicon layer 11 is formed over the first insulation layer 10. The polysilicon layer 11 can be deposited by prolyzing silane in a low pressure chemical vapor deposition process at about 620 C.

Figure 4:
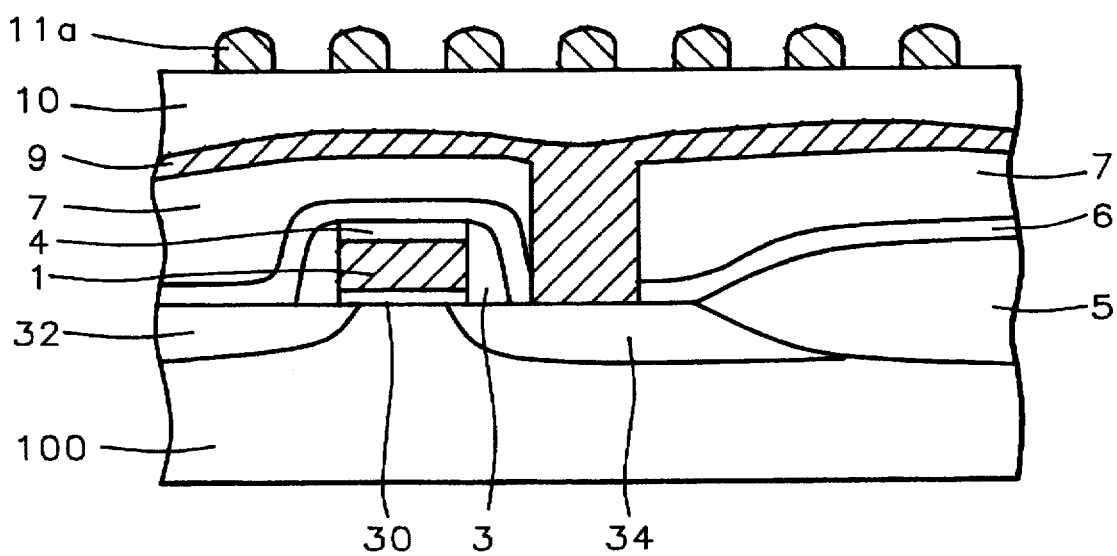

Referring to FIG. 4, the polysilicon layer 11 is treated to form a second polysilicon layer 11 A, consisting of grains (e.g., HSGs). The second polysilicon layer 11A consisting of grains, is preferably formed by depositing a polysilicon layer 11 over the first (oxide) insulation layer 10; (FIG. 3) and annealing the polysilicon layer 11 to form the hemispherical grains polysilicon 11A.

The grains 11A are preferably hemispherical shaped having a diameter in the range of between about 500 and 1500 Å and more preferably about 1000 Å. The spacing between the grains can be in the range of between about 500 and 1500 Å and more preferably about 1000 Å. The size of the grains and the spacing of the grains is important since the smaller the size and spacing, the smaller the cell area can be. The grains 11A can also be formed by the process as described in U.S. Pat. No. 5,302,540, Ko et al., (See, e.g., col. 3, lines 3 to 12) which is incorporated by reference. Alternately, the grains can be formed by the process described in U.S. Pat. No. 5,256,587, Jun et al., (See, col. 3 lines 9 to 32.) which is incorporated by reference.

Figure 11:
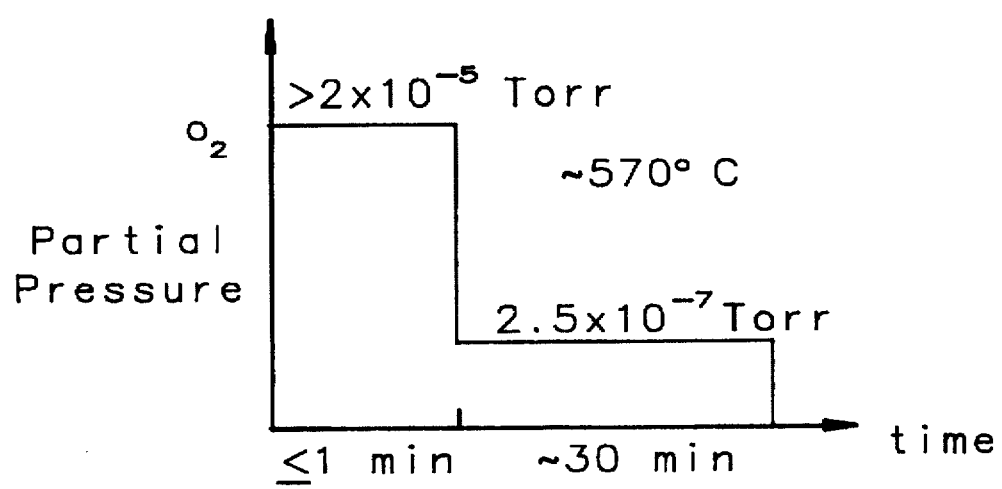
FIG. 11 is a graphical representation of the preferred two step anneal for forming the grains (HSG) of the second polysilicon layer.

The grains 11A is more preferably formed in a two step process: (1) depositing an amorphous polysilicon film 11 and (2) annealing the film to form the grains 11A. In the first step, the polysilicon layer 11 (FIG. 3) can have a thickness in the range between about 300 and 600 Å and more preferably about 500 Å. The polysilicon layer 11 can be deposited using He-diluted SiH$_4$ at a percentage between about 10 and 30% and more preferably about 20%; at a pressure in the range between about 0.5 and 2.0 Torr and more preferably about 1 torr; at a temperature in the range between about 550° to 590° C. and more preferably about 570° C. In the second step, the anneal preferably has two stages where the oxygen partial pressure is changed. The first stage of the anneal has an oxygen partial pressure in the range between about 1E-5 torr to 5E-5 torr for a time in the range between about 30 and 90 seconds and more preferably about 60 seconds; and a temperature in the range between about 550° and 590° C. and more preferably about 570° C. The second stage of the anneal has an oxygen partial pressure in the range between about 1E-07 and 3E-07 Torr and more preferably about 2.5 E-7 torr for a time in the range between about 20 and 40 minutes and a temperature in the range between about 550° and 590° C. and more preferably about 570° C. See FIG. 11 for a graph of the two step anneal. This two step anneal forms the grains 11A from the polysilicon layer 11. This two step anneal forms grains with a more uniform distribution and allows the subsequently formed honeycombs to be more uniform.

In an embodiment of the current invention, the HSG layer 11A can be etched to form wider spaces between the grains and reduce the diameter of the grains. Preferably a RIE etch is used to obtain maximum control over the spacing between the grains.

Figure 5:
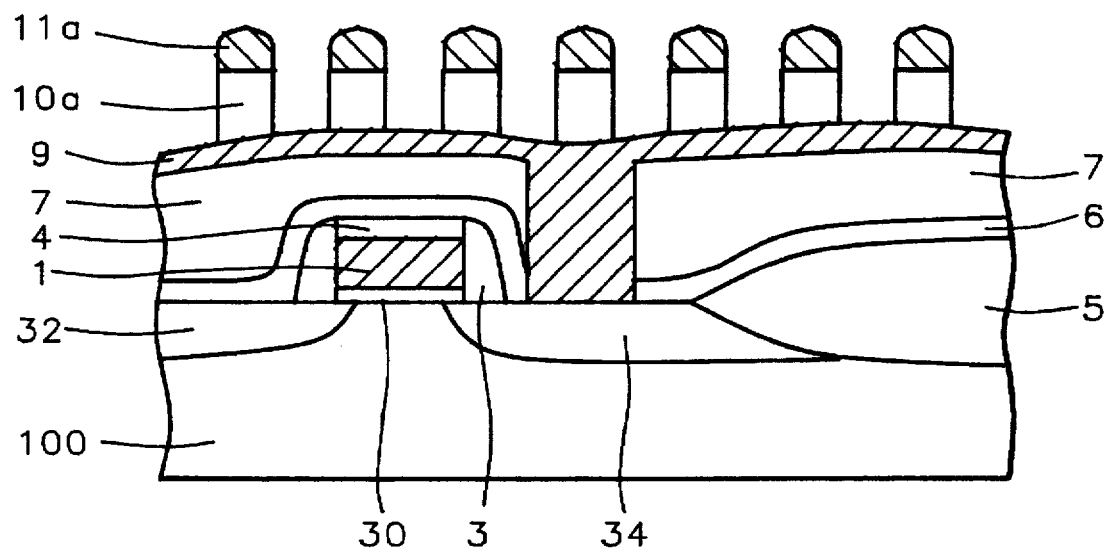

As shown in FIG. 5, the first insulation layer 10 is etched using the second polysilicon layer 11A as a mask forming pattern of vertical extensions 10A of the first insulation layer 10. The etch is preferably an anisotropic etch which is selective to silicon oxide over polysilicon. The oxide first insulation layer can be removed by anisotropic reactive ion etching with carbon tetrafluoride ($CF_4$) and oxygen as the etching ambient. Preferably, the first insulation layer is removed using a $CF_4$ and $Cl_2$ anisotropic etch with an etch oxide to polysilicon selectivity in the range of between about 10 and 25 and more preferably about 20.

The vertical extensions 10A (e.g., spaced pillars, pillarets, etc.) can have a diameter in the range of between about 0.05 and 0.15 µm and a height in the range of between about 0.4 and 0.7 µm and a spacing between the pillarets 10A in the range of between about 0.05 and 0.15 µm and more preferably about 0.1 µm.

Figure 6:
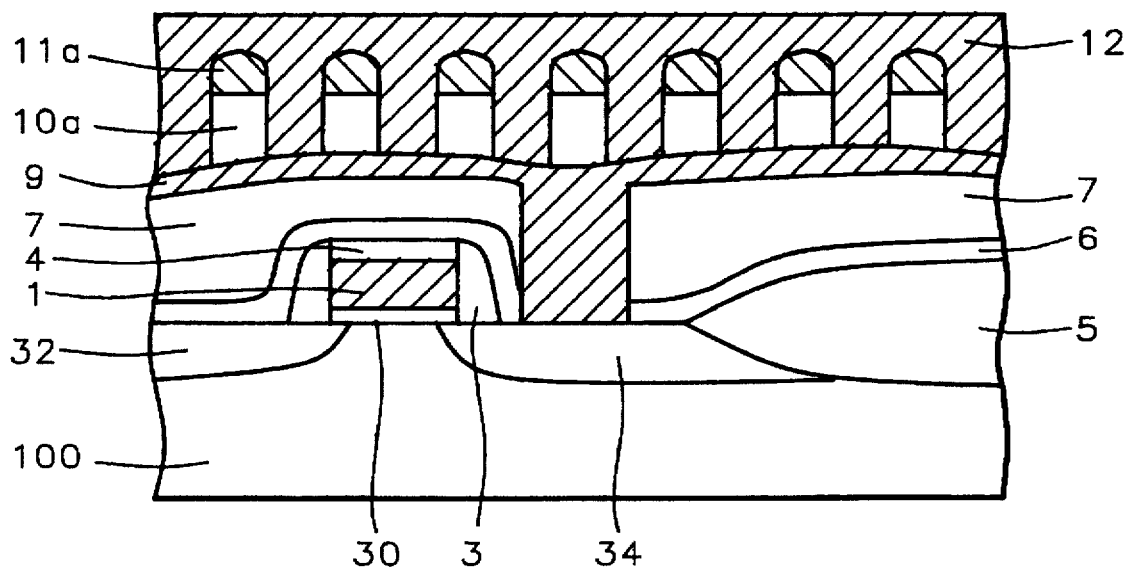

FIG. 6 shows a third polysilicon layer 12 formed over the second polysilicon layer (e.g., HSG) 11A and the pattern of vertical extensions 10A. The third polycrystalline is thick enough to completely cover the second polysilicon layer 11A and the pattern of vertical extensions 10A. The third polycrystalline layer 12 has a thickness in the range of between about 0.05 and 0.15 µm and more preferably about 0.1 µm. The third polycrystalline layer 12 has an impurity doping concentration in the range of between about 1E19 and 5E20 atoms/cm$^3$ and more preferably about 1E20 atoms/cm$^3$. The third polycrystalline layer 12 (e.g., doped polysilicon layer 12) is preferably doped with n typed impurities.

Figure 7:
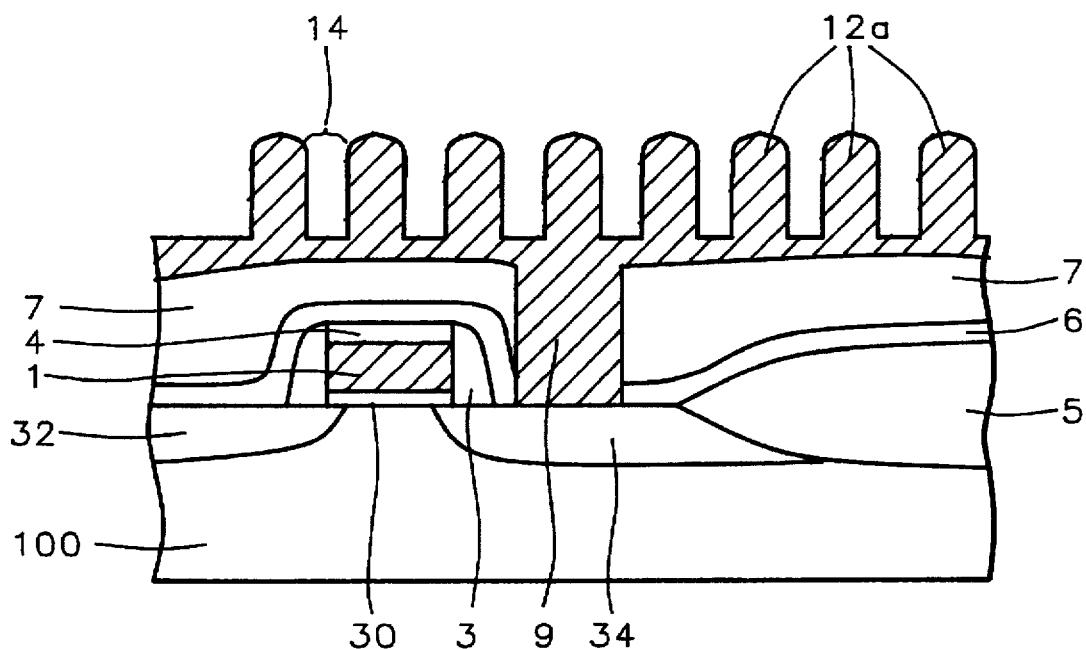

As shown in FIG. 7, the third polycrystalline layer 12 and the second polysilicon layer 11A are etched back to expose the tops of the vertical extensions 10A of the first insulation layer 10. The etch is preferably a RIE etch with a $CF_4$ and $Cl_2$ etch chemistry is used. The etch has a selectivity of polysilicon to $SiO_2$ in the range of between about 10:1 and 20:1.

Next, the vertical extensions 10A of the first insulation layer are removed by a selective etch forming holes 14 in place of the vertical extensions in the first conductive layer thereby forming the first conductive layer into a honeycomb structure 9. The diameter of the holes 14 in the range of between about 0.05 and 0.15 µm and more preferably about 0.1 µm. The thickness of the honeycomb structure 12A (e.g., the walls 12A of the third conductive layer) in the range of between about 0.3 and 0.6 µm and more preferably about 0.5 µm.

Figure 8:
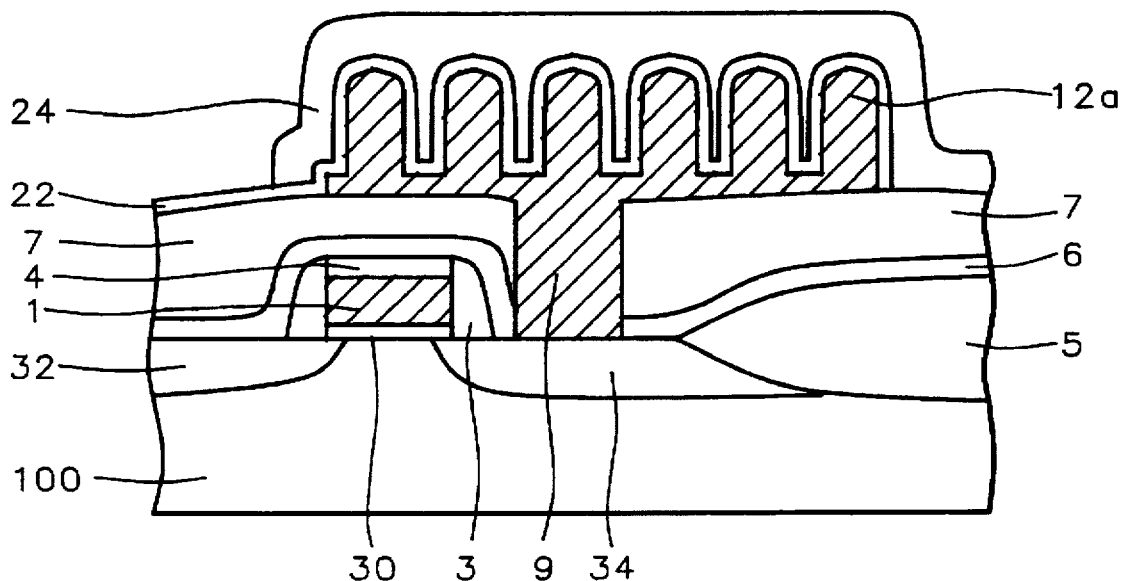

As displayed in FIG. 8, the first conductive layer 9 and the third polysilicon layer 12 are etched forming the honeycomb shaped bottom storage electrode 12A 9 thereby defining cell units. The polysilicon etch is preferably a RIE etch using $CF_4$ and $Cl_2$ reactants.

Next, a capacitor dielectric layer 22 is deposited over the bottom storage electrode 12A 9. The capacitor dielectric is preferably composed a triple film of Oxide/Nitride/Oxide (ONO), a double film of nitride/oxide, silicon nitride, and a high dielectric film, such as tantalum oxide ($Ta_2O_5$); and has a thickness in the range between about 40 and 100 Å.

Subsequently, a top plate electrode 24 is formed over the capacitor dielectric layer 22 thereby forming the honeycomb shaped capacitor. The top plate electrode 24 is preferably formed of doped polysilicon layer having a thickness in the range between about 500 and 1500 Å and an impurity concentration in the range between about 1E19 and 1E20 atoms/cm$^3$. The top plate electrode can be doped by an ion implant or an in-situ doping process. The doped polysilicon layer is patterned to a predetermined size to form the top plate electrode 24.

Figure 9:
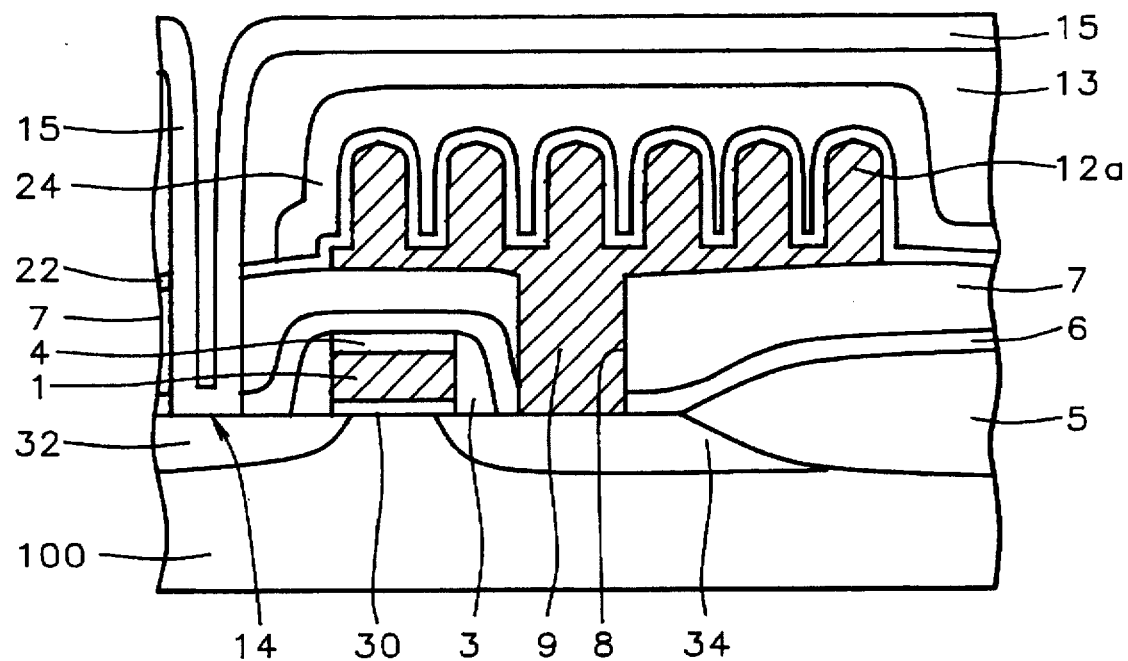
FIG. 9 is a cross sectional view taken along line 9' in FIG. 10, for illustrating a method for manufacturing a honeycomb shaped capacitor of a semiconductor memory device according to the present invention.

As shown in FIG. 9, a top insulation layer 13 is then formed over the top plate electrode 24. FIG. 9 is a cross sectional view taken along line 9' in FIG. 10. The top insulation layer 13 can be formed of silicon oxide, doped silicon oxide, or BPSG. The top insulation layer 13 is preferably formed of borophosphosilicate glass (BPSG) and can have a thickness in the range of between about 3000 and 6000 Å and more preferably about 5000 Å.

As shown in FIG. 9, a bit line opening is then formed thorough the layers overlying the drain 32 A, such as the top insulation layer 13, the capacitor dielectric layer 22 and the first planarization layer 7 to expose the surface 14 of the drain 32. A doped polysilicon layer and an overlying polycide layer 15 (optional) can be formed over the bit contact opening and makes electrical contact 14 with the drain 32. The doped polysilicon layer is patterned to form the bit line contact 15.

Figure 10:
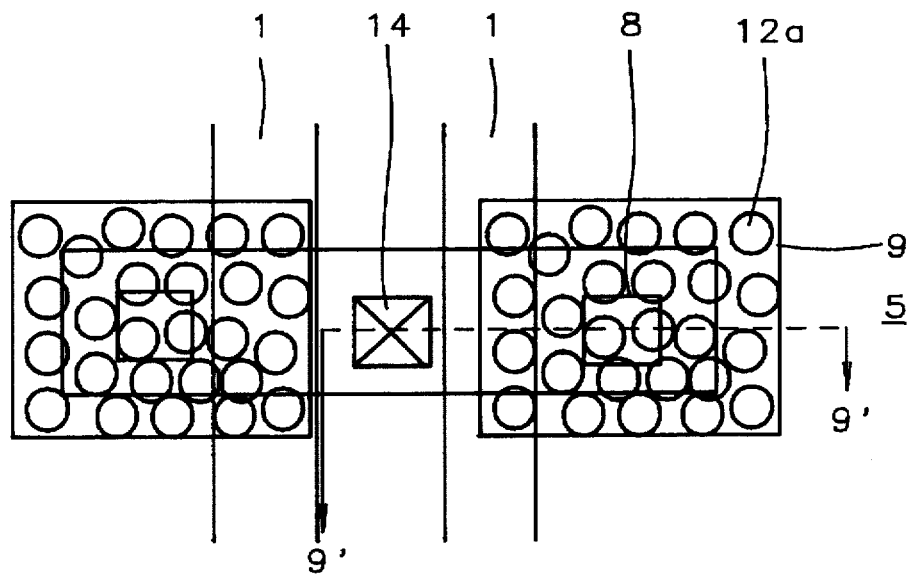
FIG. 10 is a top plan view for illustrating a method for manufacturing a honeycomb shaped capacitor of a semiconductor memory device according to the present invention.

FIG. 10 shows a top down view of the honeycomb shaped capacitor and memory cell. FIG. 9 is a cross sectional view taken along line 9' in FIG. 10. The extensions 12A are preferably cylindrical and spaced through the storage electrode.

The method of the current invention forms a honeycomb shaped capacitor which has a high surface area and capacitance. The capacitor reduces field leakage since the polysilicon honeycombs (pillarets) are not subjected to a damaging reactive ion etch (RIE) etch in the prior art processes. Moreover, the process provides better control of honeycomb structure in both the vertical and lateral dimensions. The honeycombs are defined by the vertical extensions of the first insulation layer which are defined using an etch stop process, not a timed etch. Since the vertical dimension of the honeycomb are defined by the thickness of the first insulation layer and not by the depth of a timed etch, the invention provides more uniform controllable and height honeycombs. Also, the two step oxygen anneal to form the HSG provides a more uniform distribution of HSGs and therefore provides a more uniform distribution of honeycombs in the storage electrode. This results in more uniform lateral honeycomb dimensions which increases the capacitance of the capacitor. The process is simple and inexpensive to manufacture.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a integrated semiconductor memory device having a honeycomb shaped capacitor, the method comprises the steps of:

forming a metal oxide semiconductor (MOS) device having a source and drain, adjacent to a field oxide region, in a silicon substrate;

forming a first planarization layer over said MOS device and said field oxide region;

etching a node contact hole though said first planarization layer exposing said source;

forming a first polysilicon layer on said first planarization layer and in said node contact hole;

forming a first insulation layer composed of silicon oxide covering said first polysilicon layer;

forming a second polysilicon layer, consisting of grains, over said first insulation layer; said grains of said second polysilicon layer have a diameter in a range between about 500 and 1500 Å; said second polysilicon layer consisting of grains; is formed by depositing a conformal polysilicon layer over said first insulation layer; and annealing said conformal polysilicon layer;

said conformal polysilicon layer is deposited using He-diluted SiH$_4$ at a percentage between about 10 and 30%; at a pressure in a range between about 0.5 and 2 Torr; and at a temperature in a range between about 550° to 590° C.;

the annealing of said conformal polysilicon layer comprises a two step anneal process: a first step having an oxygen partial pressure in a range between about 1E-5 and 5E-5 Torr for a time in a range between about 30 and 90 seconds and a temperature in a range between about 550° and 590° C.; and a second step having an oxygen partial pressure in a range between about 1E-7 and 3E-7 Torr for a time in a range between about 20 and 40 minutes and a temperature in a range between about 550° and 590° C.;

anisotropically etching said first insulation layer using said grains of said second polysilicon layer as a mask forming a pattern of vertical extensions of said first insulation layer;

forming a third polysilicon layer over said grains of said second polysilicon layer and said pattern of vertical extensions;

etching back said third polysilicon layer and said grains of said second polysilicon layer to expose tops of said vertical extensions of said first insulation layer;

selectively etching said vertical extensions of said first insulation layer forming holes in place of said vertical extensions in said third polysilicon layer thereby forming the third polysilicon layer into a honeycomb structure;

patterning said first polysilicon layer and said third polysilicon layer forming a honeycomb shaped bottom storage electrode over said source;

forming a capacitor dielectric layer over said bottom storage electrode; and forming a top plate electrode over said capacitor dielectric layer thereby forming said memory device having said honeycomb shaped capacitor.

2. The method of claim 1 wherein said first planarization layer is composed of a material selected from the group consisting of silicon oxide and borophosphosilicate glass; and has a thickness in a range between about 3000 and 7000 Å.

3. The method of claim 1 wherein said first polysilicon layer is formed of doped polysilicon having an impurity concentration in a range between about 1E19 and 1E20 atoms/cm$^3$ and a thickness in range between about 2000 and 3000 Å.

4. The method of claim 1 wherein said first insulation layer is composed of a material selected from the group consisting of silicon oxide and borophosphosilicate glass; and has a thickness in a range between about 4000 and 7000 Å.

5. The method of claim 1 wherein after forming said second polysilicon layer consisting of grains; etching said grains to decrease a diameter of said grains.

6. The method of claim 1 wherein said third polysilicon layer has a thickness in a range of between about 0.05 and 0.15 μm and an impurity doping concentration in a range of between about 1E19 and 1E20 atoms/cm$^3$.

7. The method of claim 1 wherein said capacitor dielectric is composed of a material selected from the group consisting of Oxide/Nitride/Oxide (ONO), silicon nitride and Ta$_2$O$_5$ and has a thickness in a range between about 40 and 100 Å.

8. The method of claim 1 wherein said top plate electrode is formed of doped polysilicon having a thickness in a range between about 500 and 1500 Å and an impurity concentration in a range between about 1E19 and 1E20 atoms/cm$^3$.

9. The method of claim 1 which further includes forming a top insulation layer over said top plate electrode;

forming a bit line contact opening through the top insulation layer, the capacitor dielectric layer and the first planarization layer to expose a surface of the drain; and forming a bit line contact in said bit line contact opening and covering said top insulation layer.

10. The method of claim 1 which further includes forming a top insulation layer over said top plate electrode; said top insulation layer is formed of a material selected from the group consisting of PSG, borophosphosilicate glass and TEOS; and has a thickness in a range of between about 3000 and 6000 Å.

11. A method of fabricating a honeycomb shaped capacitor comprising the steps of:

forming a first planarization layer over a substrate surface;

etching a node contact hole though said first planarization layer exposing a source;

forming a first polysilicon layer on said first planarization layer and in said node contact hole;

forming a first insulation layer over said first conductive layer; said first insulating composed of a material selected from the group consisting of silicon oxide and borophosphosilicate glass; and has a thickness in a range between about 4000 and 7000 Å;

forming a hemisphere particle layer over said first insulation layer; said hemisphere particle layer comprises grains having a diameter in a range between about 500 and 1500 Å;

said hemisphere particle layer is formed by depositing a conformal polysilicon layer over said first insulation layer and annealing said conformal polysilicon layer; said conformal polysilicon layer is deposited using He-diluted SiH$_4$ at a percentage between about 10 and 30%; at a pressure in a range between about 0.5 and 2 Torr; and at a temperature in a range between about 550° to 590° C.:

said annealing comprises a two step anneal process; a first step has an oxygen partial pressure in a range between about 1E-5 and 5E-5 Torr for a time in a range between about 30 and 90 seconds and a temperature in a range between about 550° and 590° C.; and a second step having an oxygen partial pressure in a range between about 1E-7 and 3E-7 Torr for a time in a range between about 20 and 40 minutes and a temperature in a range between about 550° and 590° C.;

anisotropically etching said first insulation layer using said hemisphere particle layer as a mask forming pattern of vertical extensions of said first insulation layer; said vertical extensions having a diameter in a range of between about 0.05 and 0.15 μm and a height in a range of between about 0.4 and 0.7 μm and a spacing between the vertical extensions in a range of between about 0.05 and 0.15 μm;

forming a third polysilicon layer over said hemisphere particle layer and said pattern of vertical extensions;

etching back said third polysilicon layer and said hemisphere particle layer to expose the tops of said vertical extensions of said first insulation layer;

selectively etching said vertical extensions of said first insulation layer forming holes in place of said vertical extensions in said third polysilicon layer thereby forming said third polysilicon layer into a honeycomb structure;

patterning said first polysilicon layer and said third polysilicon layer forming a honeycomb shaped bottom storage electrode over said source;

forming a capacitor dielectric layer over said bottom storage electrode; and forming a top plate electrode over said capacitor dielectric layer thereby forming said honeycomb shaped capacitor.

12. The method of claim 11 wherein said first planarization layer is composed of a material selected from the group consisting of silicon oxide and borophosphosilicate glass; and has a thickness in a range between about 3000 and 7000 Å.

13. The method of claim 11 wherein said first polysilicon layer is formed of doped polysilicon having an impurity concentration in a range between about 1E19 and 1E20 atoms/cm$^3$ and a thickness in a range between about 2000 and 3000 Å.

14. The method of claim 11 wherein after forming said hemisphere particle layer; etching said hemisphere particle layer to decrease a diameter of particles.

15. The method of claim 11 wherein said third polysilicon layer has a thickness in a range of between about 0.05 and 0.15 μm and an impurity doping concentration in a range of between about 1E19 and 1E20 atoms/cm$^3$.

16. The method of claim 11 wherein said top plate electrode is formed of doped polysilicon having a thickness in a range between about 500 and 1500 Å and an impurity concentration in a range between about 1E 19 and 1E 20 atoms/cm$^3$.

17. A method of fabricating a honeycomb shaped capacitor for a memory device comprising:

forming a first planarization layer over a substrate surface; said first planarization layer is composed of a material selected from the group consisting of silicon oxide and borophosphosilicate glass; and has a thickness in a range between about 3000 and 7000 Å;

etching a node contact hole though said first planarization layer exposing a source;

forming a first polysilicon layer superjacent said first planarization layer and in said node contact hole; said first polysilicon layer is formed of doped polysilicon having an impurity concentration in a range between about 1E 19 and 1E 20 atoms/cm$^3$ and a thickness in a range between about 2000 and 3000 Å;

forming a first insulation layer over said first polysilicon layer; said first insulation layer is composed of a material selected from the group consisting of silicon oxide and borophosphosilicate glass; and has a thickness in a range between about 4000 and 7000 Å;

forming a conformal polysilicon layer over said first insulation layer; and annealing said conformal polysilicon layer in a partial oxygen ambient thereby forming a hemisphere particle layer over said first insulation layer; said hemisphere particle layer comprises grains having a diameter in a range between about 500 and 1500 Å;

said hemisphere particle layer, is formed by depositing a conformal polysilicon layer over said first insulation layer; and annealing said conformal polysilicon layer; and said conformal polysilicon layer is deposited using He-diluted SiH$_4$ at a percentage between about 10 and 30%; at a pressure in a range between about 0.5 and 2 Torr; and at a temperature in a range between about 550° to 590° C.;

said annealing comprises a two step anneal process; a first step has an oxygen partial pressure in a range between about 1E-5 and 1.9E-5 Torr for a time in a range between about 30 and 90 seconds and a temperature in a range between about 550° and 590° C.; and a second step having an oxygen partial pressure in a range between about 2.6E-7 and 3.0E-7 Torr for a time in a range between about 20 and 40 minutes and a temperature in a range between about 550° and 590° C.;

etching said hemisphere particle layer to decrease the diameter of said particles;

anisotropically etching said first insulation layer using said hemisphere particle layer as a mask forming pattern of vertical extensions of said first insulation layer; said vertical extensions having a diameter in a range of between about 0.05 and 0.15 μm and a height in a range of between about 0.4 and 0.7 μm and a spacing between the vertical extensions in a range of between about 0.05 and 0.15 μm;

forming a third polysilicon layer over said hemisphere particle layer and said pattern of vertical extensions; said third polysilicon layer has a thickness in a range of between about 0.05 and 0.15 μm and an impurity doping concentration in a range of between about 1E 19 and 1E 20 atoms/cm$^3$;

etching back said third polysilicon layer and said hemisphere particle layer to expose tops of said vertical extensions of said first insulation layer;

selectively etching said vertical extensions of said first insulation layer forming holes in place of said vertical extensions in said first polysilicon layer thereby forming the third polysilicon layer into a honeycomb structure;

patterning said first polysilicon layer and said third polysilicon layer forming a honeycomb shaped bottom storage electrode over said source;

forming a capacitor dielectric layer over said bottom storage electrode; and forming a top plate electrode over said capacitor dielectric layer thereby forming said honeycomb shaped capacitor; said top plate electrode is formed of doped polysilicon having a thickness in a range between about 500° and 1500 Å and an impurity concentration in a range between about 1E19 and 1E 20 atoms/cm$^3$.

* * * * *